(12) United States Patent
Chang (10) Patent No.: US 11,483,648 B2
(45) Date of Patent: Oct. 25, 2022

(54) DRIVER CIRCUIT OF CAPACITIVE SPEAKER

(71) Applicant: ANPEC ELECTRONICS CORPORATION, Hsinchu (TW)

(72) Inventor: Ming-Hung Chang, Hsinchu (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 50 days.

(21) Appl. No.: 17/242,421

(22) Filed: Apr. 28, 2021

(65) Prior Publication Data

US 2022/0210550 A1 Jun. 30, 2022

(30) Foreign Application Priority Data

Dec. 30, 2020 (TW) ................... 109146787

(51) Int. Cl.
*H04R 3/00* (2006.01)
*H04R 19/02* (2006.01)
*H03F 3/183* (2006.01)

(52) U.S. Cl.
CPC ............... *H04R 3/00* (2013.01); *H03F 3/183* (2013.01); *H04R 19/02* (2013.01); *H03F 2200/03* (2013.01)

(58) Field of Classification Search
CPC ........... H04R 3/00; H04R 19/02; H03F 3/183; H03F 2200/03
See application file for complete search history.

(56) References Cited

U.S. PATENT DOCUMENTS

| 10,085,089 B1* | 9/2018 | Shen | H03F 1/523 |
| 10,911,009 B2* | 2/2021 | Hogan | H04R 3/00 |
| 2019/0007010 A1* | 1/2019 | Høyerby | H03F 3/2173 |
| 2019/0120883 A1* | 4/2019 | Shen | H03F 3/2173 |
| 2022/0060159 A1* | 2/2022 | Lesso | H03F 3/181 |

FOREIGN PATENT DOCUMENTS

| JP | 2005109665 A * | 4/2005 |
| JP | 5711041 B2 * | 4/2015 |

* cited by examiner

*Primary Examiner* — David L Ton
(74) *Attorney, Agent, or Firm* — Li & Cai Intellectual Property (USA) Office (57) ABSTRACT

A driver circuit of a capacitive speaker is provided. Positive and negative power terminals of a first output stage circuit are respectively coupled to a first power source and a second power source. The first output stage circuit outputs a first voltage signal to a first terminal of a capacitive load of the capacitive speaker according to a first audio input signal, a voltage of the first power source and a voltage of the second power source. Positive and negative power terminals of a second output stage circuit are respectively coupled to the second power source and a third power source. The second output stage circuit outputs a second voltage signal to a second terminal of the capacitive load of the capacitive speaker according to a second audio input signal, a voltage of the second power source and a voltage of the third power source.

19 Claims, 8 Drawing Sheets

DRIVER CIRCUIT OF CAPACITIVE SPEAKER

CROSS-REFERENCE TO RELATED PATENT APPLICATION

This application claims the benefit of priority to Taiwan Patent Application No. 109146787, filed on Dec. 30, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a capacitive speaker, and more particularly to a driver circuit of a capacitive speaker.

BACKGROUND OF THE DISCLOSURE

Speakers are widely used in people's daily lives and bring convenience to people. The speakers are important sound playback devices and widely used in various electronic products such as computers. In recent years, with constant advancement of technology, the speakers are increasingly being designed to be thinner, smaller and lighter.

However, capacitors and resistors need to be disposed between the speaker and an output stage of a conventional driver circuit of the speaker. The capacitors are used to remove a direct current (DC) voltage from the signal outputted by the output stage of the conventional driver circuit to output an alternating current (AC) signal. Then, the AC signal is adjusted by the resistors connected to voltage sources. As a result, the speaker plays an audio signal having a desired volume. However, the capacitors and the resistors not only occupy space, but also cause additional power consumption in the conventional driver circuit.

SUMMARY OF THE DISCLOSURE

In response to the above-referenced technical inadequacies, the present disclosure provides a driver circuit of a capacitive speaker having a capacitive load. The driver circuit includes a first output stage circuit and a second output stage circuit. A positive power terminal of the first output stage circuit is coupled to a first power source. A negative power terminal of the first output stage circuit is connected to a node, and receives a voltage of the node as a second power source. A first audio input terminal of the first output stage circuit is connected to an input circuit and receives a first audio input signal from the input circuit. An output terminal of the first output stage circuit is connected to a first terminal of the capacitive load. The first output stage circuit is configured to generate a first voltage signal according to the first audio input signal, a voltage of the first power source and the voltage of the second power source. A positive power terminal of the second output stage circuit is connected to the node and receives the voltage of the second power source through the node. A negative power terminal of the second output stage circuit is coupled to a third power source. A second audio input terminal of the second output stage circuit is connected to the input circuit and receives a second audio input signal from the input circuit. An output terminal of the second output stage circuit is connected to a second terminal of the capacitive load. The second output stage circuit is configured to generate a second voltage signal according to the second audio input signal, the voltage of the second power source and a voltage of the third power source. The first output stage circuit outputs the first voltage signal to the capacitive load and the second output stage circuit outputs the second voltage signal to the capacitive load, such that the capacitive load plays an audio output signal.

In certain embodiment, the voltage of the first power source is higher than that of the second power source, and the voltage of the second power source is higher than that of the third power source, such that a voltage of the first voltage signal is maintained to be higher than a voltage of the second voltage signal.

In certain embodiment, the first output stage circuit includes a first transistor and a second transistor. A control terminal of the first transistor is connected to the input circuit. A first terminal of the first transistor is coupled to the first power source. A second terminal of the first transistor is connected to a first terminal of the second transistor and the first terminal of the capacitive load. A control terminal of the second transistor is connected to the input circuit. A second terminal of the second transistor is connected to the node.

In certain embodiment, the second output stage circuit includes a third transistor and a fourth transistor. A control terminal of the third transistor is connected to the input circuit. A first terminal of the third transistor is connected to the node. A second terminal of the third transistor is connected to a first terminal of the fourth transistor and the second terminal of the capacitive load. A control terminal of the fourth transistor is connected to the input circuit. A second terminal of the fourth transistor is coupled to the third power source.

In certain embodiment, the second terminal of the fourth transistor is grounded and the voltage of the third power source is zero.

In certain embodiment, when the capacitive load is being charged, a first current flows to the first transistor from the first power source, then flows to the capacitive load, then flows to the fourth transistor, and finally flows to the third power source.

In certain embodiment, when the capacitive load is being charged, a voltage difference between the first voltage signal and the second voltage signal gradually increases, the first voltage signal gradually rises, and the third power source absorbs the first current such that the second voltage signal gradually decreases.

In certain embodiment, when the capacitive load is being discharged, a second current of the capacitive load flows to the second transistor, then flows to the third transistor, and finally flows to the capacitive load.

In certain embodiment, when the capacitive load is being discharged, a voltage difference between the first voltage signal and the second voltage signal gradually decreases. The second power source absorbs the second current such that the first voltage signal gradually falls. The second power source outputs the second current such that the second voltage signal gradually rises. A value of the second current absorbed by the second power source is equal to a value of the second current outputted by the second power source such that a net current provided by the second power source is zero.

In certain embodiment, the first output stage circuit includes a first amplifier. A first input terminal of the first amplifier is connected to the input circuit through a first input resistor. The first input terminal of the first amplifier is connected to an output terminal of the first amplifier through a first feedback resistor. The first amplifier calculates a first average value of the voltage of the first power source and the voltage of the second power source as a voltage of a second input terminal of the first amplifier. Then, the first amplifier calculates a first difference between the first average value and a voltage of the first audio input signal. Then, the first amplifier multiplies the first difference by a first gain to output the first voltage signal.

In certain embodiment, the second output stage circuit includes a second amplifier. A first input terminal of the second amplifier is connected to the input circuit through a second input resistor. The first input terminal of the second amplifier is connected to an output terminal of the second amplifier through a second feedback resistor. The second amplifier calculates a second average value of the voltage of the second power source and the voltage of the third power source as a voltage of a second input terminal of the second amplifier. Then, the second amplifier calculates a second difference between the second average value and a voltage of the second audio input signal, and multiplies the second difference by a second gain to output the second voltage signal.

In certain embodiment, the driver circuit further includes a first power source circuit. The first power source circuit is connected to the positive power terminal of the first output stage circuit. The first power source circuit is configured to provide the first power source to the positive power terminal of the first output stage circuit.

In certain embodiment, the driver circuit further includes a second power source circuit. The second power source circuit is connected to the negative power terminal of the second output stage circuit. The second power source circuit is configured to provide the third power source to the negative power terminal of the second output stage circuit.

In certain embodiment, the driver circuit further includes a modulating circuit. The modulating circuit is connected between the input circuit and the first power source circuit. The modulating circuit is configured to generate a first modulation signal according to an amplitude of the first audio input signal. The first power source circuit provides the first power source according to the first modulation signal.

In certain embodiment, the modulating circuit is connected between the input circuit and the second power source circuit. The modulating circuit is configured to generate a second modulation signal according to an amplitude of the second audio input signal. The second power source circuit provides the third power source according to the second modulation signal.

In certain embodiment, the modulating circuit is configured to output a third modulation signal to the node as the second power source according to the amplitude of the first audio input signal and the amplitude of the second audio input signal.

In certain embodiment, the driver circuit further includes a buffer circuit. The buffer circuit is connected to the node. The buffer circuit is configured to maintain the second power source of the node at a constant voltage and output the constant voltage according to the third modulation signal. The modulating circuit is connected between the input circuit and the buffer circuit.

In certain embodiment, the third power source is a negative voltage and the negative power terminal of the first output stage circuit is grounded through the node. As a result, a voltage of the first voltage signal falls within a range from the voltage of the first power source to a zero voltage, and a voltage of the second voltage signal falls within a range from the zero voltage to the voltage of the third power source.

In certain embodiment, the driver circuit further includes a buffer circuit. The buffer circuit is connected to the node and configured to maintain the second power source of the node at a constant voltage.

As described above, the present disclosure provides the driver circuit of the capacitive speaker, which eliminates the need for capacitors and resistors to be disposed in a space of a conventional driver circuit of the speaker and causing additional power consumption. In addition, the driver circuit of the present disclosure has a better frequency response than that of the conventional driver circuit at a low frequency.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 1:
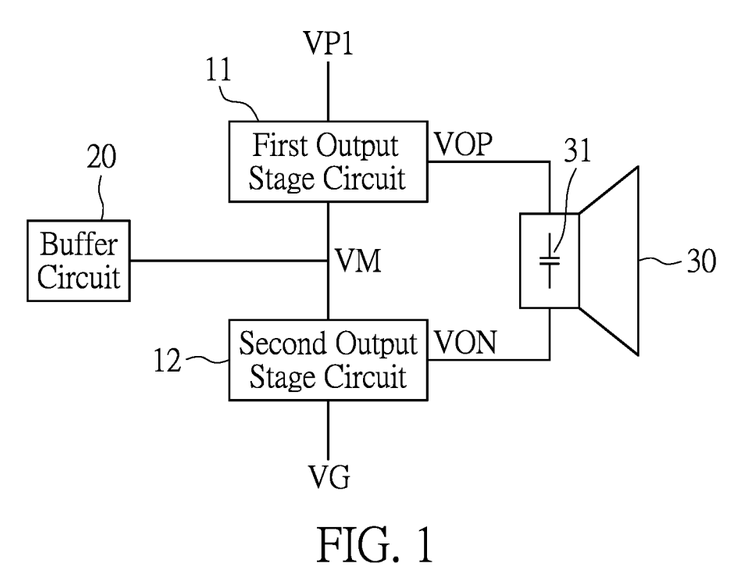
FIG. 1 is a block diagram of a capacitive speaker and a driver circuit thereof according to a first embodiment of the present disclosure.
Figure 2:
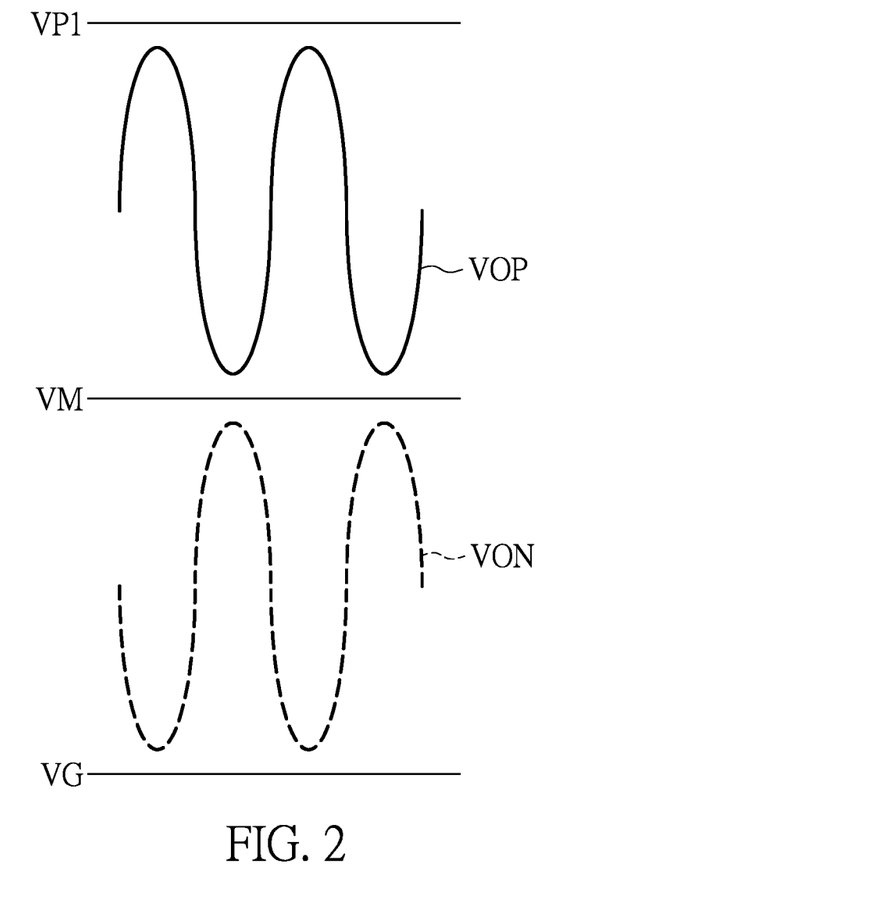
FIG. 2 is a waveform diagram of a first voltage signal and a second voltage signal of the driver circuit of the capacitive speaker according to the first embodiment of the present disclosure.

Reference is made to FIGS. 1 and 2, in which FIG. 1 is a block diagram of a capacitive speaker and a driver circuit thereof according to a first embodiment of the present disclosure, and FIG. 2 is a waveform diagram of a first voltage signal and a second voltage signal of the driver circuit of the capacitive speaker according to the first embodiment of the present disclosure.

As shown in FIG. 1, in the embodiment, the driver circuit includes a first output stage circuit 11, a second output stage circuit 12 and a buffer circuit 20, and is applicable to a capacitive speaker 30. The capacitive speaker 30 includes a capacitive load 31.

The buffer circuit 20 is connected to a node and configured to maintain a second power source VM of the node at a constant voltage.

A positive power terminal of the first output stage circuit 11 is coupled to a first power source VP1. A negative power terminal of the first output stage circuit 11 is connected to a node and receives a voltage of the node as the second power source VM. A first audio input terminal of the first output stage circuit 11 is connected to an input circuit and receives a first audio input signal from the input circuit. An output terminal of the first output stage circuit 11 is connected to a first terminal such as a positive power terminal of the capacitive load 31. The first output stage circuit 11 is configured to generate a first voltage signal VOP according to the first audio input signal, a voltage of the first power source VP1 and the voltage of the second power source VM.

A positive power terminal of the second output stage circuit 12 is connected to the node to which the voltage of the second power source VM is provided, and receives the voltage of the second power source VM through the node. A negative power terminal of the second output stage circuit 12 is coupled to a third power source VG. For example, a voltage of the third power source VG is zero and a negative power terminal of the second output stage circuit 12 is (equivalently) grounded. A second audio input terminal of the second output stage circuit 12 is connected to the input circuit and receives a second audio input signal from the input circuit. The second audio input signal may be the same as or different from the first audio input signal described above. An output terminal of the second output stage circuit 12 is connected to a second terminal such as a negative power terminal of the capacitive load 31. The second output stage circuit 12 is configured to generate a second voltage signal VON according to the second audio input signal, the voltage of the second power source VM and the voltage of the third power source VG.

The first output stage circuit 11 outputs the first voltage signal VOP to the capacitive load 31 and the second output stage circuit 12 outputs the second voltage signal VON to the capacitive load 31, such that the capacitive speaker 30 plays an audio output signal. A volume of the audio output signal played by the capacitive speaker 30 depends on amplitudes of the first voltage signal VOP and the second voltage signal VON.

As shown in FIG. 2, the voltage of the first power source VP1 is higher than the voltage of the second power source VM, and the voltage of the second power source VM is higher than the voltage of the third power source VG. That is, the voltage of the second power source VM falls within a range from the voltage of the first power source VP1 to the voltage of the third power source VG. A voltage of the first voltage signal VOP is maintained to be higher than a voltage of the second voltage signal VON. As a result, the audio output signal played by the capacitive speaker 30 has a better sound quality.

Second Embodiment

Figure 3:
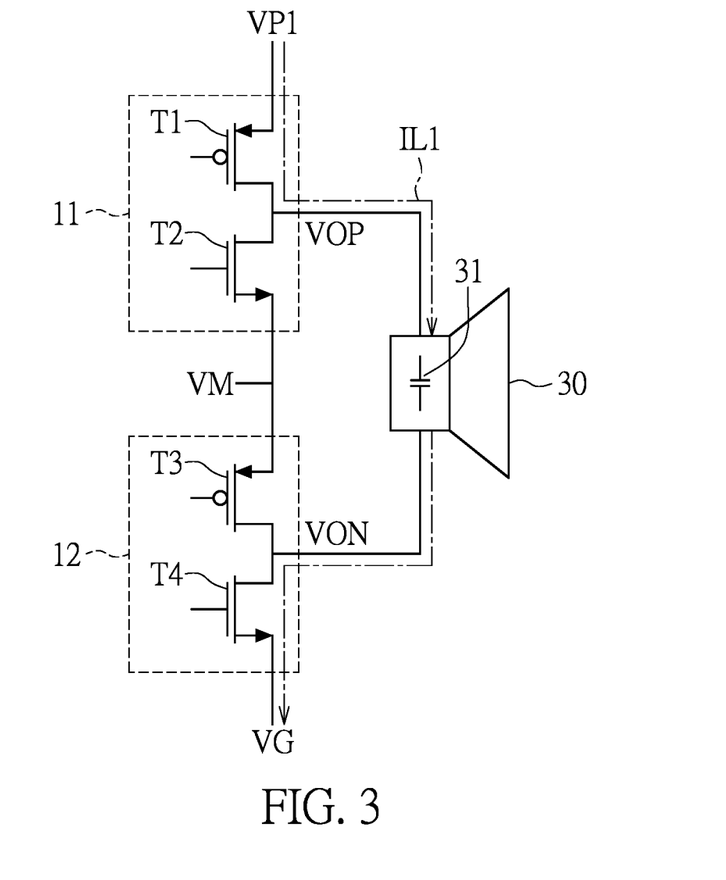
FIG. 3 is a circuit layout diagram of a driver circuit and a capacitive speaker that is being charged according to a second embodiment of the present disclosure.
Figure 4:
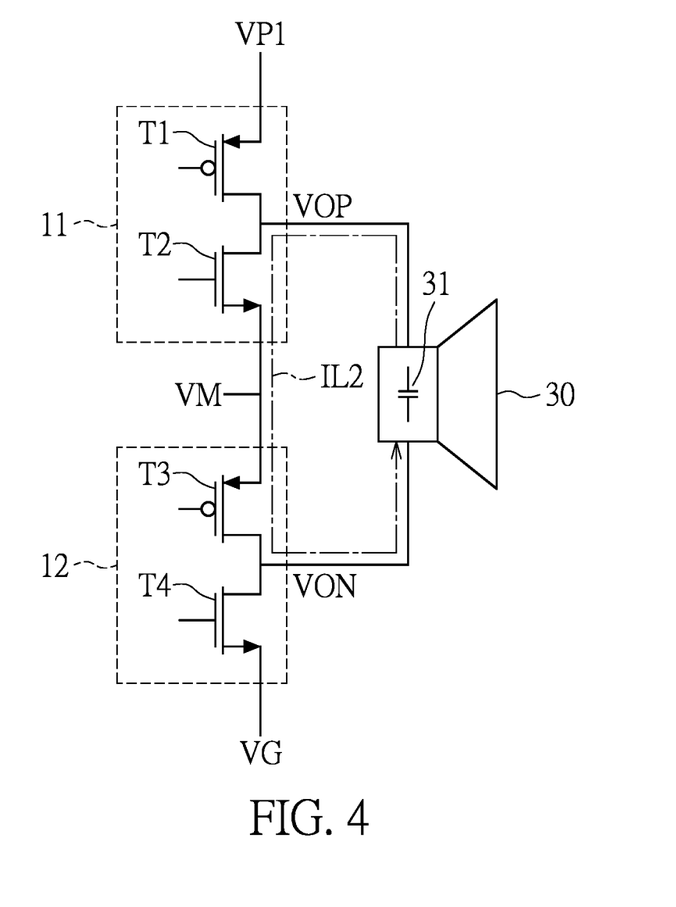
FIG. 4 is a circuit layout diagram of the driver circuit and the capacitive speaker that is being discharged according to the second embodiment of the present disclosure.
Figure 5:
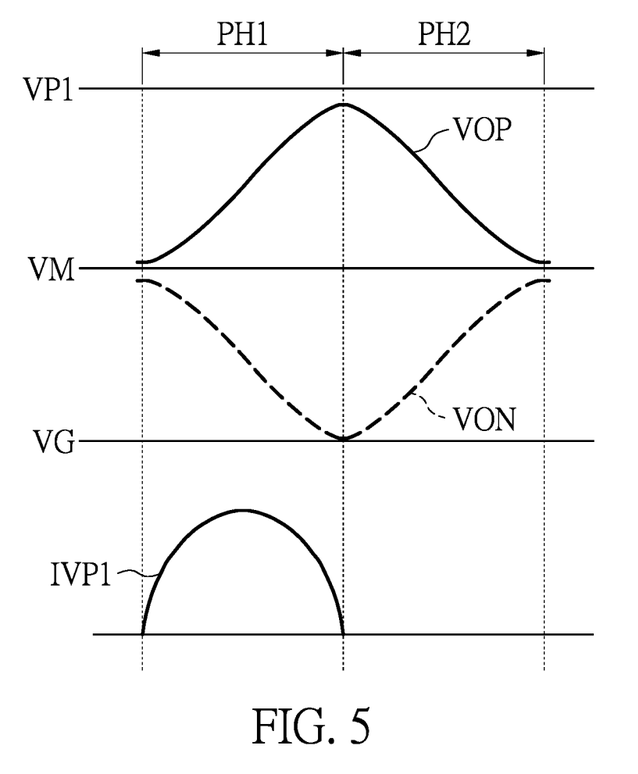
FIG. 5 is a waveform diagram of a first voltage signal, a second voltage signal and a first current signal of the driver circuit of the capacitive speaker according to the second embodiment of the present disclosure.

Reference is made to FIGS. 3 to 5, in which FIG. 3 is a circuit layout diagram of a driver circuit and a capacitive speaker that is being charged according to a second embodiment of the present disclosure, FIG. 4 is a circuit layout diagram of the driver circuit and the capacitive speaker that is being discharged according to the second embodiment of the present disclosure, and FIG. 5 is a waveform diagram of a first voltage signal, a second voltage signal and a first current signal of the driver circuit of the capacitive speaker according to the second embodiment of the present disclosure.

As shown in FIG. 3, in the embodiment, the driver circuit includes the first output stage circuit 11 and the second output stage circuit 12, and is applicable to the capacitive speaker 30 having the capacitive load 31. The first output stage circuit 11 shown in FIGS. 1, 7 and 8 may be the same as the first output stage circuit 11 shown in FIG. 3. The second output stage circuit 12 shown in FIGS. 1, 7 and 8 may be the same as the second output stage circuit 12 shown in FIG. 3.

As shown in FIG. 3, the first output stage circuit 11 may include a first transistor T1 and a second transistor T2. For example, the first transistor T1 may be a P-type metal oxide semiconductor (PMOS) transistor and the second transistor T2 may be an N-type metal oxide semiconductor (NMOS) transistor, but the present disclosure is not limited thereto.

A first terminal of the first transistor T1 is coupled to the first power source VP1. A second terminal of the first transistor T1 is connected to a first terminal of the second transistor T2 and the first terminal of the capacitive load 31. A second terminal of the second transistor T2 is connected to the node to which the voltage of the second power source VM is provided. A control terminal of the first transistor T1 and a control terminal of the second transistor T2 are connected to the input circuit.

Similarly, the second output stage circuit 12 may include a third transistor T3 and a fourth transistor T4. For example, the third transistor T3 may be a P-type metal oxide semiconductor (PMOS) transistor and the fourth transistor T4 may be an N-type metal oxide semiconductor (NMOS) transistor, but the present disclosure is not limited thereto.

A first terminal of the third transistor T3 is connected to the node to which the second power source VM is provided. A second terminal of the third transistor T3 is connected to a first terminal of the fourth transistor T4 and the second terminal of the capacitive load 31. A second terminal of the fourth transistor T4 is coupled to the third power source VG. For example, the second terminal of the fourth transistor T4 is grounded. A control terminal of the third transistor T3 and a control terminal of the fourth transistor T4 are connected to the input circuit.

The input circuit may output the same or different first audio input signals respectively to the control terminal of the first transistor T1 and the control terminal of the second transistor T2 to control the first transistor T1 and the second transistor T2. In addition, the input circuit may output the same or different second audio input signals respectively to the control terminal of the third transistor T3 and the control terminal of the fourth transistor T4 to control the third transistor T3 and the fourth transistor T4.

As shown in FIG. 3, when the capacitive load 31 of the capacitive speaker 30 is being charged, a first current IL1 flows to the first transistor T1 from the first power source VP1, then flows to the capacitive load 31, then flows to the fourth transistor T4, and finally flows to the third power source VG. For example, the first current IL1 finally flows to ground. As shown in FIG. 5, the first voltage signal VOP gradually rises, and the third power source VG absorbs the first current IL1 such that the second voltage signal VON gradually decreases and a voltage difference between the first voltage signal VOP and the second voltage signal VON gradually increases, during a charging time interval of a first phase PH1.

As shown in FIG. 4, when the capacitive load 31 of the capacitive speaker 30 is being discharged, a second current IL2 of the capacitive load 31 flows to the second transistor T2, then flows to the third transistor T3, and finally flows back to the capacitive load 31 of the capacitive speaker 30. As shown in FIG. 5, the second power source VM absorbs the second current IL2 flowing through the second transistor T2 such that the first voltage signal VOP gradually falls during a discharging time interval of a second phase PH2. At the same time, the second power source VM outputs the second current IL2 to the third transistor T3 such that the second voltage signal VON gradually rises. As a result, the voltage difference between the first voltage signal VOP and the second voltage signal VON gradually decreases, during the discharging time interval of the second phase PH2.

If a value of the second current IL2 of the second transistor T2 that is absorbed by the second power source VM is equal to a value of the second current IL2 flowing through the third transistor T3, a net current provided by the second power source VM is zero. Therefore, as shown in FIG. 5, in the embodiment, the first power source VP1 of the driver circuit of the capacitive speaker 30 only needs to provide a charging current that is a first current IVP1 within the charging time interval of the first phase PH1 instead of the discharging time interval of the second phase PH2. In contrast, a conventional driver circuit of the capacitive speaker 30 needs to provide charging currents within both of the charging time interval of the first phase PH1 and the discharging time interval of the second phase PH2. Therefore, the driver circuit of the embodiment consumes only half of energy consumed by the conventional driver circuit of the capacitive speaker 30.

Third Embodiment

Figure 6:
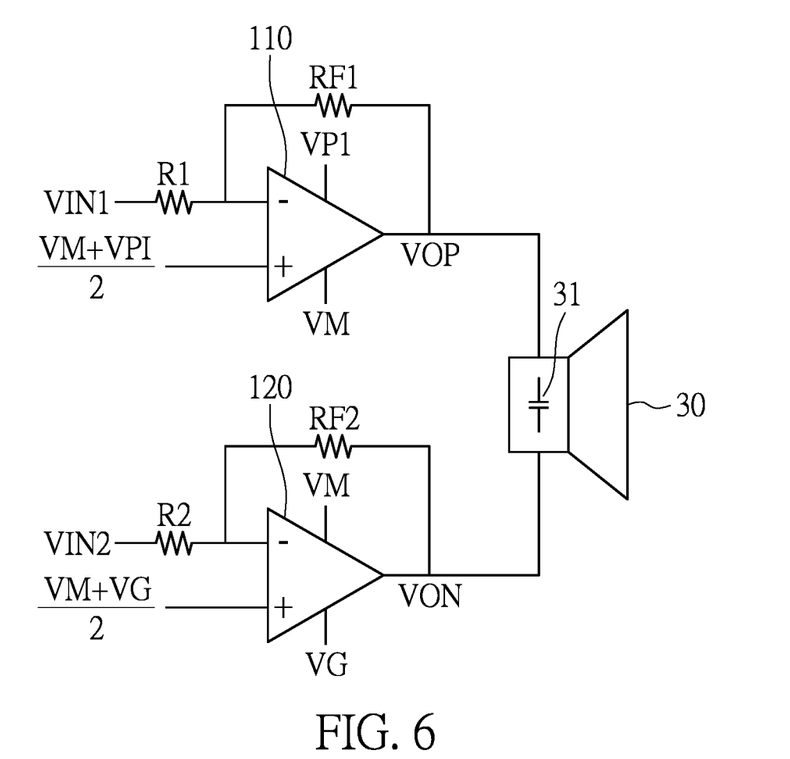
FIG. 6 is a circuit layout diagram of a driver circuit of a capacitive speaker according to a third embodiment of the present disclosure.

Reference is made to FIG. 6, which is a circuit layout diagram of a driver circuit of a capacitive speaker according to a third embodiment of the present disclosure.

As shown in FIG. 6, in the embodiment, the driver circuit may include a first amplifier 110 and a second amplifier 120, and is applicable to the capacitive speaker 30 having the capacitive load 31. The first output stage circuit 11 shown in FIGS. 1, 7 and 8 may include the first amplifier 110 shown in FIG. 6. The second output stage circuit 12 shown in FIGS. 1, 7 and 8 may include the second amplifier 120 shown in FIG. 6.

A positive power terminal of the first amplifier 110 is coupled to the first power source VP1. A negative power terminal of the first amplifier 110 is coupled to the second power source VM. A first input terminal such as an inverting input terminal of the first amplifier 110 may be connected to an output terminal of the first amplifier 110 through a first feedback resistor RF1. The first input terminal of the first amplifier 110 may be connected to the input circuit through a first input resistor R1 and receive a first audio input signal VIN1 from the input circuit.

A second input terminal such as a non-inverting input terminal of the first amplifier 110 may be coupled to a first reference signal. For example, the first amplifier 110 calculates a first average value of the voltage of the first power source VP1 and the voltage the second power source VM as a voltage of the second input terminal such as the non-inverting input terminal of the first amplifier 110. That is, the voltage of the first reference signal may be equal to the first average value. Then, the first amplifier 110 calculates a first difference between the first average value and a voltage of the first audio input signal VIN1. Then, the first amplifier 110 multiplies the first difference by a first gain to generate the first voltage signal VOP. The first gain is equal to a resistance of the first feedback resistor RF1 divided by a resistance of the first input resistor R1.

A positive power terminal of the second amplifier 120 is coupled to the second power source VM. A negative power terminal of the second amplifier 120 is coupled to the third power source VG. A first input terminal such as an inverting input terminal of the second amplifier 120 may be connected to an output terminal of the second amplifier 120 through a second feedback resistor RF2. The first input terminal of the second amplifier 120 may be connected to the input circuit and receive a second audio input signal VIN2 from the input circuit through the second input resistor R2.

A second input terminal such as a non-inverting input terminal of the second amplifier 120 may be coupled to a second reference signal. For example, the second amplifier 120 may calculate a second average value of the voltage of the second power source VM and the voltage of the third power source VG as a voltage of the second input terminal such as the non-inverting input terminal of the second amplifier 120. That is, the voltage of the second reference signal may be equal to the second average value. Then, the second amplifier 120 calculates a second difference between the second average value and a voltage of the second audio input signal VIN2. Then, the second amplifier 120 multiplies the second difference by a second gain to generate the second voltage signal VON. The second gain is equal to a resistance of the second feedback resistor RF2 divided by a resistance of the second input resistor R2.

The first amplifier 110 may output the first voltage signal VOP and the second amplifier 120 may output the second voltage signal VON to the capacitive load 31 of the capacitive speaker 30 such that the capacitive speaker 30 plays the audio signal having a desired volume.

Fourth Embodiment

Figure 7:
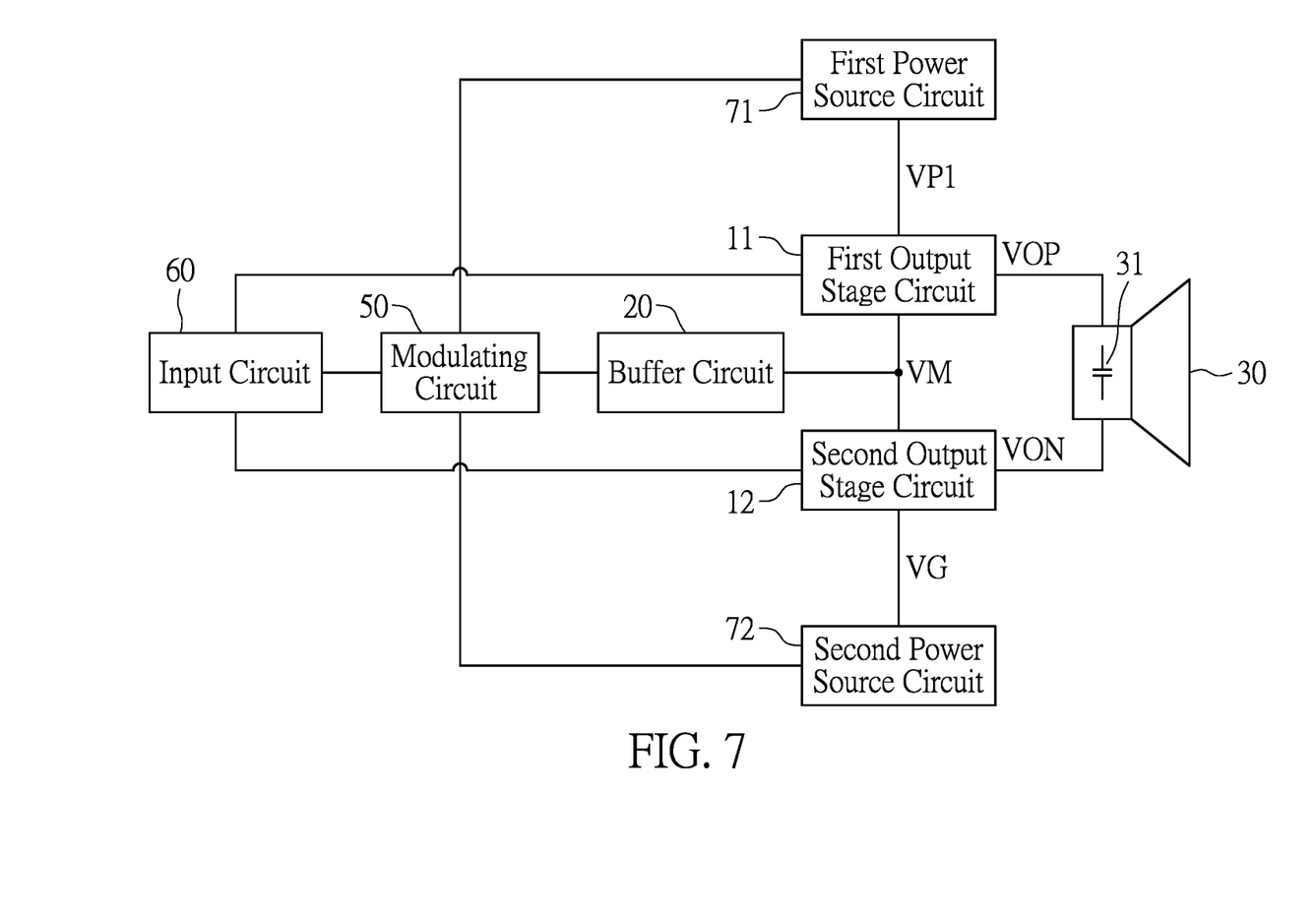
FIG. 7 is a circuit layout diagram of a driver circuit of a capacitive speaker according to a fourth embodiment of the present disclosure.

Reference is made to FIG. 7, which is a circuit layout diagram of a driver circuit of a capacitive speaker according to a fourth embodiment of the present disclosure. The same descriptions of the first to fourth embodiments are not repeated herein.

As shown in FIG. 7, in the embodiment, the driver circuit may include the first output stage circuit 11, the second output stage circuit 12, the buffer circuit 20, a modulating circuit 50, an input circuit 60, a first power source circuit 71 and a second source circuit 72, and is applicable to the capacitive speaker 30 having the capacitive load 31. The input circuit described in the first to third embodiments may be replaced with the input circuit 60 shown in FIG. 7.

The first power source circuit 71 may be connected to the positive power terminal of the first output stage circuit 11. The modulating circuit 50 may be connected between the input circuit 60 and the first power source circuit 71. The modulating circuit 50 may generate a first modulation signal according to an amplitude of the first audio input signal outputted by the input circuit 60. The first power source circuit 71 may provide the first power source VP1 to the positive power terminal (of the first amplifier 110) of the first output stage circuit 11 according to the first modulation signal.

The second power source circuit 72 may be connected to the negative power terminal of the second output stage circuit 12. The modulating circuit 50 may be connected between the input circuit 60 and the second power source circuit 72. The modulating circuit 50 may generate a second modulation signal according to an amplitude of the second audio input signal outputted by the input circuit 60. The second power source circuit 72 may output the third power source VG to the negative power terminal (of the second amplifier 120) of the second output stage circuit 12 according to the second modulation signal.

The modulating circuit 50 may be connected between the input circuit 60 and the buffer circuit 20. The modulating circuit 50 may generate a third modulation signal according to the amplitude of the first audio input signal and the amplitude of the second audio input signal. The buffer circuit 20 may output the second power source VM to the negative power terminal of the first output stage circuit 11 and the positive power terminal of the second output stage circuit 12 according to the third modulation signal.

Fifth Embodiment

Figure 8:
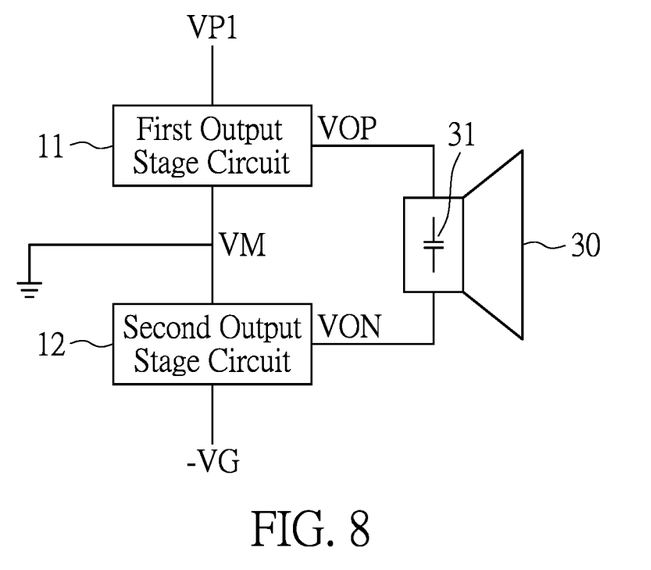
FIG. 8 is a circuit layout diagram of a driver circuit of a capacitive speaker according to a fifth embodiment of the present disclosure.

Reference is made to FIG. 8, which is a circuit layout diagram of a driver circuit of a capacitive speaker according to a fifth embodiment of the present disclosure. The same descriptions of the first and fifth embodiments are not repeated herein, but differences between the first and fifth embodiments are described in the following.

In the first embodiment, the buffer circuit 20 is disposed in the driver circuit of the capacitive speaker 30, and connected to the node between the first output stage circuit 11 and the second output stage circuit 12. The node is connected to the buffer circuit 20. The negative power terminal of the first output stage circuit 11 and the positive power terminal of the second output stage circuit 12 receive the second power source VM through the node from the buffer circuit 20.

However, in the fifth embodiment, any buffer circuit is not disposed in the driver circuit of the capacitive speaker 30. The node between the first output stage circuit 11 and the second output stage circuit 12 is grounded. The negative power terminal of the first output stage circuit 11 and the positive power terminal of the second output stage circuit 12 are grounded through the node and receive zero voltages from ground. In addition, the third power source VG coupled to the negative power terminal of the second output stage circuit 12 may have a negative voltage. As a result, the voltage of the first voltage signal VOP received by the capacitive speaker 30 falls within a range from the first power source VP1 to the zero voltage. The voltage of the second voltage signal VON received by the capacitive speaker 30 falls within a range from the zero voltage to the negative voltage.

In summary, the present disclosure provides the driver circuit of the capacitive speaker, which eliminates the need for capacitors and resistors to be disposed in a space of a conventional driver circuit of the speaker and causing additional power consumption. In addition, the driver circuit of the present disclosure has a better frequency response than that of the conventional driver circuit at a low frequency.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A driver circuit of a capacitive speaker, wherein the capacitive speaker has a capacitive load, the driver circuit comprising:

a first output stage circuit, wherein a positive power terminal of the first output stage circuit is coupled to a first power source, a negative power terminal of the first output stage circuit is connected to a node, and receives a voltage of the node as a second power source, a first audio input terminal of the first output stage circuit is connected to an input circuit and receives a first audio input signal from the input circuit, an output terminal of the first output stage circuit is connected to a first terminal of the capacitive load, and the first output stage circuit is configured to generate a first voltage signal according to the first audio input signal, a voltage of the first power source and the voltage of the second power source; and a second output stage circuit, wherein a positive power terminal of the second output stage circuit is connected to the node and receives the voltage of the second power source through the node, a negative power terminal of the second output stage circuit is coupled to a third power source, a second audio input terminal of the second output stage circuit is connected to the input circuit and receives a second audio input signal from the input circuit, an output terminal of the second output stage circuit is connected to a second terminal of the capacitive load, and the second output stage circuit is configured to generate a second voltage signal according to the second audio input signal, the voltage of the second power source and a voltage of the third power source;

wherein the first output stage circuit outputs the first voltage signal to the capacitive load and the second output stage circuit outputs the second voltage signal to the capacitive load, such that the capacitive load plays an audio output signal.

2. The driver circuit according to claim 1, wherein the voltage of the first power source is higher than that of the second power source, and the voltage of the second power source is higher than that of the third power source, such that a voltage of the first voltage signal is maintained to be higher than a voltage of the second voltage signal.

3. The driver circuit according to claim 1, wherein the first output stage circuit includes a first transistor and a second transistor, a control terminal of the first transistor is connected to the input circuit, a first terminal of the first transistor is coupled to the first power source, a second terminal of the first transistor is connected to a first terminal of the second transistor and the first terminal of the capacitive load, a control terminal of the second transistor is connected to the input circuit, and a second terminal of the second transistor is connected to the node.

4. The driver circuit according to claim 3, wherein the second output stage circuit includes a third transistor and a fourth transistor, a control terminal of the third transistor is connected to the input circuit, a first terminal of the third transistor is connected to the node, a second terminal of the third transistor is connected to a first terminal of the fourth transistor and the second terminal of the capacitive load, a control terminal of the fourth transistor is connected to the input circuit, and a second terminal of the fourth transistor is coupled to the third power source.

5. The driver circuit according to claim 4, wherein the second terminal of the fourth transistor is grounded and the voltage of the third power source is zero.

6. The driver circuit according to claim 5, wherein, when the capacitive load is charged, a first current flows to the first transistor from the first power source, then flows to the capacitive load, then flows to the fourth transistor, and finally flows to the third power source.

7. The driver circuit according to claim 6, wherein, when the capacitive load is charged, a voltage difference between the first voltage signal and the second voltage signal gradually increases, the first voltage signal gradually rises, and the third power source absorbs the first current such that the second voltage signal gradually decreases.

8. The driver circuit according to claim 7, wherein, when the capacitive load is discharged, a second current of the capacitive load flows to the second transistor, then flows to the third transistor, and finally flows to the capacitive load.

9. The driver circuit according to claim 8, wherein, when the capacitive load is discharged, a voltage difference between the first voltage signal and the second voltage signal gradually decreases, the second power source absorbs the second current such that the first voltage signal gradually falls, the second power source outputs the second current such that the second voltage signal gradually rises, and a value of the second current absorbed by the second power source is equal to a value of the second current outputted by the second power source such that a net current provided by the second power source is zero.

10. The driver circuit according to claim 1, wherein the first output stage circuit includes a first amplifier, a first input terminal of the first amplifier is connected to the input circuit through a first input resistor, the first input terminal of the first amplifier is connected to an output terminal of the first amplifier through a first feedback resistor, the first amplifier calculates a first average value of the voltage of the first power source and the voltage of the second power source as a voltage of a second input terminal of the first amplifier, the first amplifier then calculates a first difference between the first average value and a voltage of the first audio input signal, and the first amplifier multiplies the first difference by a first gain to output the first voltage signal.

11. The driver circuit according to claim 10, wherein the second output stage circuit includes a second amplifier, a first input terminal of the second amplifier is connected to the input circuit through a second input resistor, the first input terminal of the second amplifier is connected to an output terminal of the second amplifier through a second feedback resistor, the second amplifier calculates a second average value of the voltage of the second power source and the voltage of the third power source as a voltage of a second input terminal of the second amplifier, the second amplifier then calculates a second difference between the second average value and a voltage of the second audio input signal, and then multiplies the second difference by a second gain to output the second voltage signal.

12. The driver circuit according to claim 1, further comprising:
a first power source circuit connected to the positive power terminal of the first output stage circuit and configured to provide the first power source to the positive power terminal of the first output stage circuit.

13. The driver circuit according to claim 12, further comprising:
a second power source circuit connected to the negative power terminal of the second output stage circuit and configured to provide the third power source to the negative power terminal of the second output stage circuit.

14. The driver circuit according to claim 13, further comprising:
a modulating circuit connected between the input circuit and the first power source circuit and configured to generate a first modulation signal according to an amplitude of the first audio input signal, wherein the first power source circuit provides the first power source according to the first modulation signal.

15. The driver circuit according to claim 14, wherein the modulating circuit is connected between the input circuit and the second power source circuit and configured to generate a second modulation signal according to an amplitude of the second audio input signal, wherein the second power source circuit provides the third power source according to the second modulation signal.

16. The driver circuit according to claim 15, wherein the modulating circuit is configured to output a third modulation signal to the node as the second power source according to the amplitude of the first audio input signal and the amplitude of the second audio input signal.

17. The driver circuit according to claim 16, further comprising:
a buffer circuit connected to the node and configured to maintain the second power source of the node at a constant voltage and output the constant voltage according to the third modulation signal, wherein the modulating circuit is connected between the input circuit and the buffer circuit.

18. The driver circuit according to claim 1, wherein the third power source is a negative voltage and the negative power terminal of the first output stage circuit is grounded through the node, such that a voltage of the first voltage signal falls within a range from the voltage of the first power source to a zero voltage, and a voltage of the second voltage signal falls within a range from the zero voltage to the voltage of the third power source.

19. The driver circuit according to claim 1, further comprising:
  a buffer circuit connected to the node and configured to maintain the second power source of the node at a constant voltage.

* * * * *